(12) United States Patent
Kang et al.

(10) Patent No.: US 11,018,270 B2
(45) Date of Patent: May 25, 2021

(54) FLUX COATING DEVICE AND METHOD FOR SOLAR CELL PANEL, AND APPARATUS FOR ATTACHING INTERCONNECTOR OF SOLAR CELL PANEL

(71) Applicant: LG ELECTRONICS INC., Seoul (KR)

(72) Inventors: Woojoong Kang, Seoul (KR); Jangho Kim, Seoul (KR); Dongju Kang, Seoul (KR); Minseok Choi, Seoul (KR); Kwangkyu Song, Seoul (KR); Yihwan Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 48 days.

(21) Appl. No.: 16/295,392

(22) Filed: Mar. 7, 2019

(65) Prior Publication Data
US 2019/0280132 A1  Sep. 12, 2019

(30) Foreign Application Priority Data

Mar. 8, 2018  (KR) .................. 10-2018-0027692

(51) Int. Cl.
| | |
|---|---|
| *B23K 3/00* | (2006.01) |
| *H01L 31/0216* | (2014.01) |
| *H01L 31/02* | (2006.01) |
| *H01L 31/05* | (2014.01) |
| *H01L 31/18* | (2006.01) |
| *B23K 3/08* | (2006.01) |

(52) U.S. Cl.
CPC .......... *H01L 31/02167* (2013.01); *B23K 3/00* (2013.01); *B23K 3/082* (2013.01); *H01L 31/02013* (2013.01); *H01L 31/0504* (2013.01); *H01L 31/0512* (2013.01); *H01L 31/188* (2013.01)

(58) Field of Classification Search
CPC ............. H01L 31/02167; H01L 31/188; H01L 31/0512; H01L 31/02013; H01L 31/0504; Y02E 10/50; B23K 3/082
See application file for complete search history.

(56) References Cited

U.S. PATENT DOCUMENTS

| | | | | |
|---|---|---|---|---|
| 2,093,857 A | * | 9/1937 | Williamson | ............... C23C 2/06 427/367 |
| 2,127,413 A | * | 8/1938 | Leguillon | ................ B29B 15/12 204/476 |

(Continued)

FOREIGN PATENT DOCUMENTS

| | | |
|---|---|---|
| CN | 1365122 A | 8/2002 |
| CN | 103956405 A | 7/2014 |

(Continued)

*Primary Examiner* — Kiley S Stoner
(74) *Attorney, Agent, or Firm* — Birch, Stewart, Kolasch & Birch, LLP

(57) ABSTRACT

A flux coating device for a solar cell panel, can include a flux bath configured to receive flux and having an inlet and an outlet, in which the inlet and the outlet of the flux bath are configured to pass an interconnector below a surface of the flux, and the interconnector can include a wiring material including: a rounded portion or a circular cross-section, a core layer, and a solder layer formed on a surface of the core layer.

15 Claims, 10 Drawing Sheets

(56) References Cited

U.S. PATENT DOCUMENTS

| | | | | |
|---|---|---|---|---|
| 2,332,978 A * | 10/1943 | Ahern | | 118/63 |
| 3,728,144 A * | 4/1973 | Van Poucke | | C23C 2/003 |
| | | | | 427/295 |
| 3,809,570 A * | 5/1974 | Herman | | C23C 2/006 |
| | | | | 427/321 |
| 3,826,227 A * | 7/1974 | Allison | | B23K 1/085 |
| | | | | 118/60 |
| 3,826,690 A * | 7/1974 | Bleinberger et al. | | |
| | | | | B21C 37/045 |
| | | | | 148/526 |
| 3,927,816 A * | 12/1975 | Nakamura | | B23K 11/0873 |
| | | | | 228/147 |
| 3,941,866 A * | 3/1976 | Ingraham | | B05D 7/20 |
| | | | | 264/135 |
| 4,237,186 A * | 12/1980 | Ingraham | | B05D 7/20 |
| | | | | 264/129 |
| 4,316,750 A * | 2/1982 | Gengler | | B23K 3/082 |
| | | | | 118/302 |
| 4,330,574 A * | 5/1982 | Pierson | | C23C 2/40 |
| | | | | 427/319 |
| 4,444,814 A * | 4/1984 | Flinchum | | C23C 2/40 |
| | | | | 118/419 |
| 4,466,999 A * | 8/1984 | Leonard | | C23C 2/40 |
| | | | | 427/329 |
| 4,476,805 A * | 10/1984 | Higuchi | | B05C 9/02 |
| | | | | 118/410 |
| 4,684,054 A * | 8/1987 | Iwasa | | B23K 1/08 |
| | | | | 228/180.1 |
| 5,040,281 A * | 8/1991 | Sumiyoshi | | H05K 3/3489 |
| | | | | 264/628 |
| 5,069,158 A * | 12/1991 | Rey | | B05C 3/125 |
| | | | | 118/410 |
| 5,273,634 A * | 12/1993 | Fukui | | C23G 5/00 |
| | | | | 204/192.34 |
| 5,358,744 A * | 10/1994 | Buscarlet | | C23C 2/12 |
| | | | | 427/320 |
| 5,827,576 A * | 10/1998 | Carter | | C23C 2/24 |
| | | | | 427/436 |
| 5,965,210 A * | 10/1999 | Tada | | C23C 2/24 |
| | | | | 427/434.7 |
| 6,315,829 B1 * | 11/2001 | Ishii | | C23C 2/40 |
| | | | | 118/419 |
| 6,436,556 B1 * | 8/2002 | Bieck | | C23C 2/006 |
| | | | | 428/681 |
| 8,636,198 B1 * | 1/2014 | Linderman | | B23K 1/012 |
| | | | | 228/180.21 |
| 10,290,761 B2 * | 5/2019 | Kim | | H01L 31/0504 |
| 2002/0011511 A1 | 1/2002 | Takahashi et al. | | |
| 2003/0089432 A1 * | 5/2003 | Carey, II | | B23K 35/262 |
| | | | | 148/527 |
| 2013/0029054 A1 * | 1/2013 | Malloy | | C23G 3/023 |
| | | | | 427/444 |
| 2015/0034004 A1 * | 2/2015 | Dubois | | C23C 2/40 |
| | | | | 118/419 |
| 2015/0140218 A1 * | 5/2015 | Takahashi | | F27D 7/06 |
| | | | | 427/321 |
| 2015/0368776 A1 * | 12/2015 | Bergen | | C23C 2/003 |
| | | | | 118/419 |
| 2017/0104124 A1 * | 4/2017 | Kim | | B23K 3/082 |
| 2020/0189035 A1 * | 6/2020 | von der Heydt | | B23K 35/365 |

FOREIGN PATENT DOCUMENTS

| | | | | |
|---|---|---|---|---|
| CN | 205473942 U | | 8/2016 | |
| EP | 2 224 493 A2 | | 9/2010 | |
| EP | 3 151 288 A1 | | 4/2017 | |
| EP | 3 157 065 A1 | | 4/2017 | |
| JP | 60248890 A * | | 12/1985 | |
| JP | 61076654 A * | | 4/1986 | C23C 2/38 |
| JP | 61076655 A * | | 4/1986 | C23C 2/38 |
| JP | 62007840 A * | | 1/1987 | |
| JP | 05161965 A * | | 6/1993 | |
| JP | 2005-235971 A | | 9/2005 | |
| WO | WO 2012/069995 A2 | | 5/2012 | |

* cited by examiner

FLUX COATING DEVICE AND METHOD FOR SOLAR CELL PANEL, AND APPARATUS FOR ATTACHING INTERCONNECTOR OF SOLAR CELL PANEL

CROSS-REFERENCE TO RELATED APPLICATION

This application claims priority to and the benefit of Korean Patent Application No. 10-2018-0027692, filed in the Republic of Korea on Mar. 8, 2018, the entire contents of which are incorporated herein by reference.

BACKGROUND OF THE INVENTION

Field of the Invention

Embodiments of the invention relate to a flux coating device and a flux coating method for a solar cell panel, and an apparatus for attaching an interconnector of a solar cell panel, and more particularly, to a flux coating device and a flux coating method for a solar cell panel for applying or coating a flux on an interconnector for connecting a plurality of solar cells, and an apparatus for attaching an interconnector of a solar cell panel using the same.

Description of the Related Art

A plurality of solar cells are connected in series or in parallel by interconnectors, and are manufactured in a form of a solar cell panel by a packaging process for protecting a plurality of solar cells.

In order to improve an adhesion property of an interconnector, a flux may be applied or coated on an interconnector. In the related art flux coating process, undesirable damage may occur in an interconnector or a flux may not be uniformly and sufficiently applied or coated on an interconnector.

SUMMARY OF THE INVENTION

Therefore, embodiments of the invention have been made in view of the above problems, and embodiments of the invention are to provide a flux coating device and a flux coating method for a solar cell panel, and an apparatus for attaching an interconnector of a solar cell panel using the same.

A flux coating device for a solar cell panel according to an embodiment of the invention includes a flux bath for receiving a flux and having an inlet and an outlet configured to allow an interconnector to pass below a surface of the flux.

A flux coating method for a solar cell panel according to an embodiment uses a flux bath for receiving a flux and having an inlet and an outlet configured to allow an interconnector to pass below a surface of the flux. The flux is coated by a dipping process through moving the interconnector in the flux from the inlet to the outlet without a change in a route.

An apparatus for attaching an interconnector of a solar cell panel according to an embodiment of the invention includes: a flux portion for coating a flux on an interconnector; and an attaching portion for attaching the interconnector to a solar cell by soldering through providing pressure and heat to the interconnector and the solar cell. The flux portion includes a flux bath for receiving the flux and having an inlet and an outlet configured to allow the interconnector to pass below a surface of the flux.

According to an embodiment, a flux is applied or coated by a dipping process through moving an interconnector without a change in a route in a flux coating device, and thus, the flux can be coated on the interconnector with a sufficient thickness as a whole. Particularly, when the interconnector has a rounded portion or a circular cross-section and includes a solder layer, a flux layer can be formed to have a sufficient thickness on an entire surface of the interconnector, and thus, an adhesion property of the interconnector and the solar cell can be improved.

DETAILED DESCRIPTION OF THE EMBODIMENTS

Figure 1:
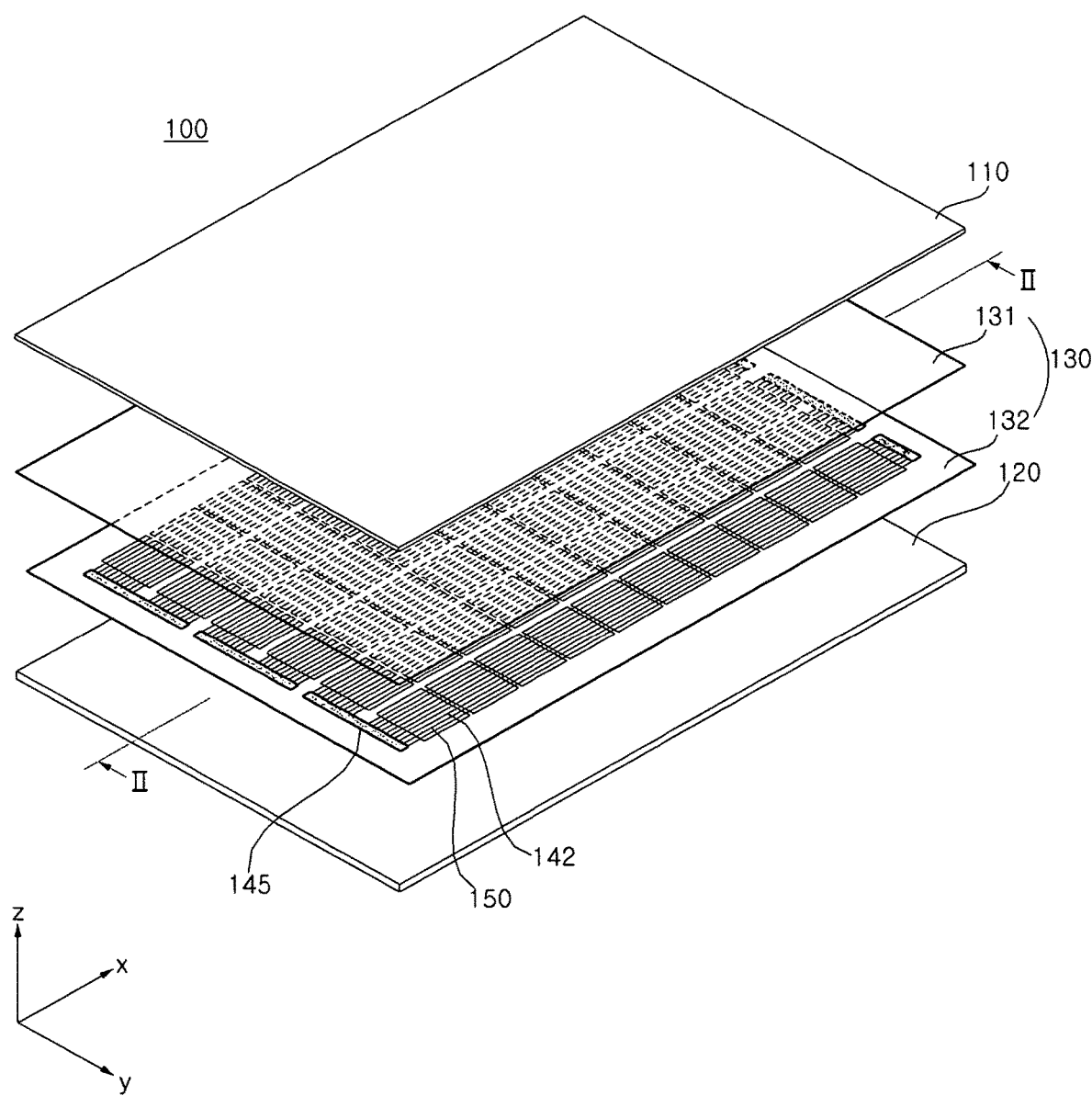
FIG. 1 is a perspective view showing a solar cell panel according to an embodiment of the invention.

Reference will now be made in detail to various embodiments of the invention, examples of which are illustrated in accompanying drawings. The invention may, however, be embodied in many alternate forms and should not be construed as limited to the embodiments set forth herein.

In the drawings, illustration of parts unrelated to embodiments of the invention is omitted to clearly and simply describe embodiments of the invention. The same reference numerals designate the same or very similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also therebetween. Accordingly, when an element such as a layer, film, region, or plate is disposed "directly on" another element, this means that there is no intervening element between the elements.

Hereinafter, a flux coating device and a flux coating method for a solar cell panel, and an apparatus for attaching an interconnector of a solar cell panel according to an embodiment of the invention will be described in detail with reference to the accompanying drawings. For a clear explanation, a solar cell panel including an interconnector, which is attached by using an apparatus and a method for attaching an interconnector of a solar cell panel according to an embodiment, will be described first, and then, a flux coating device and a flux coating method, and an apparatus and a method for attaching an interconnector of a solar cell panel using the same according to an embodiment will be described. Hereinafter, terms of "first", "second", and the like are used for distinguishing elements between each other, and embodiments of the invention are not limited thereto.

Figure 2:
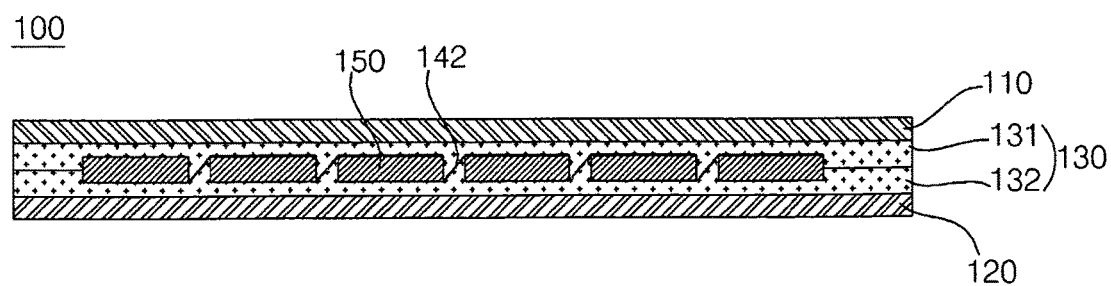
FIG. 2 is a cross-sectional view taken along line II-II of FIG. 1.

FIG. 1 is a perspective view showing a solar cell panel according to an embodiment of the invention, and FIG. 2 is a cross-sectional view taken along line II-II of FIG. 1.

Referring to FIGS. 1 and 2, a solar cell panel 100 according to an embodiment includes a plurality of solar cells 150 and wiring materials 142 electrically connecting the plurality of solar cells 150. The solar cell panel 100 may include a sealing member 130 that surrounds and seals the plurality of solar cells 150 and the wiring materials 142 connecting the plurality of solar cells 150, a front substrate 110 positioned at a front surface of the solar cell 150 on the sealing member 130, and a back substrate 120 positioned at a back surface of the solar cell 150 on the sealing member 130. This will be described in more detail.

First, the solar cell 150 may include a photoelectric conversion unit that converts solar energy into electric energy, and an electrode electrically connected to the photoelectric conversion unit to collect and deliver current. A plurality of solar cells 150 may be electrically connected in series, parallel, or series-parallel by the wiring material 142. Specifically, the wiring material 142 electrically connects two neighboring solar cells 150 among the plurality of solar cells 150.

A bus ribbon 145 may be connected to the wiring materials 142 positioned at ends of a solar cell string, which is a column of the plurality of solar cells 150 connected through the wiring materials 142, and may extend in direction crossing the solar cell string. For example, bus ribbons 145 may connect opposite ends of a plurality of solar cell strings in an alternating manner. The bus ribbons 145 may connect adjacent ones of solar cell strings, or connect the solar cell string to a junction box for preventing reversal of current. A material, a shape, and a connection structure of the bus ribbons 145 may be varied and thus the embodiments of the invention are not limited thereto.

The sealing member 130 may include a first sealing member 131 disposed on the front surfaces of the solar cells 150 connected to each other by the wiring materials 142, and a second sealing member 132 disposed on the back surfaces of the solar cells 150 connected to each other by the wiring materials 142. The first sealing member 131 and the second sealing member 132 block a permeation of moisture or oxygen, and chemically combine elements constituting the solar cell panel 100. For the first sealing member 131 and the second sealing member 132, an insulating material having a transparent property and an adhesive property may be used. As an example, ethylene vinyl acetate (EVA) copolymer resin, polyvinyl butyral, silicone resin, ester-based resin, olefin-based resin, or the like may be used for the first sealing member 131 and the second sealing member 132. The back substrate 120, the second sealing member 132, the solar cells 150, the first sealing member 131, the front substrate 110 or so on may have an integrated structure to form the solar cell panel 100 through a lamination process using the first sealing member 131 and the second sealing member 132.

The front substrate 110 is disposed on the first sealing member 131 and constitutes a front surface of the solar cell panel 100. The back substrate 120 is disposed on the second sealing member 132 and constitutes a back surface of the solar cell panel 100. The front substrate 110 and the back substrate 120 may be made of an insulating material capable of protecting the solar cells 150 from external impact, moisture, ultraviolet, or so on. Also, the front substrate 110 may be made of an optically-transparent material that light can be transmitted through. The back substrate 120 may be a sheet made of an optically-transparent material, a non-optically-transparent material, a reflective material, or the like. For example, the front substrate 110 may be a glass substrate. The back substrate 120 may have a Tedlar/PET/Tedlar (TPT) type or may have a structure in which a layer of polyvinylidene fluoride (PVDF) resin or the like is formed on at least one surface of a base layer (e.g., polyethylene terephthalate (PET)).

However, the embodiments of the invention are not limited thereto. Thus, the first sealing member 131 and the second sealing member 132, the front substrate 110, or the back substrate 120 may be made of any of various materials other than the above materials and may have any of various structures other than the above structures. For example, the front substrate 110 or the back substrate 120 may have various structures (e.g., a substrate, a film, a sheet, or so on) or various materials.

Figure 3:
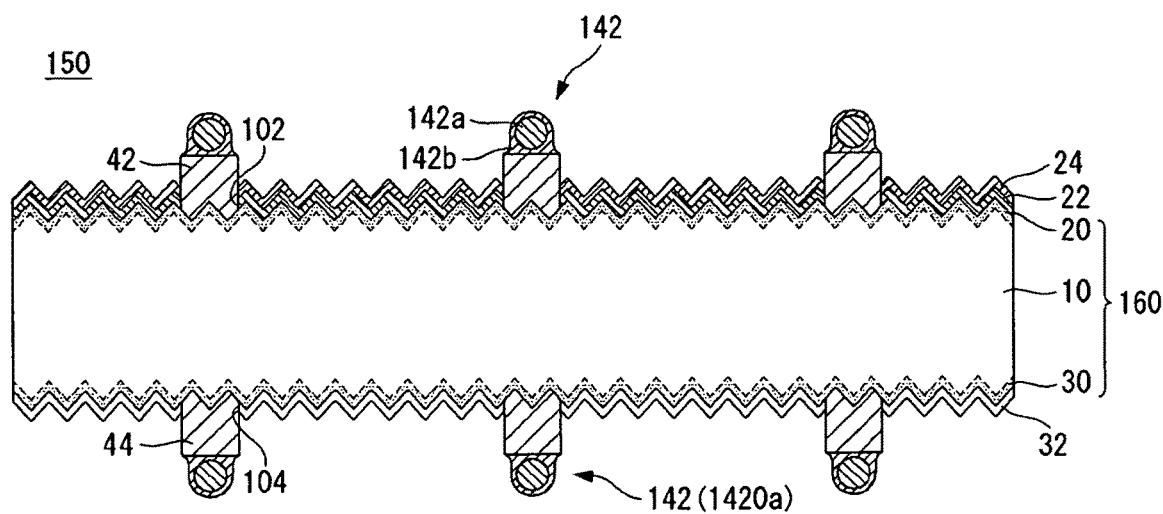
FIG. 3 is a partial cross-sectional view of an example of a solar cell and wiring materials connected thereto, which are included in the solar cell panel shown in FIG. 1.

An example of the solar cell 150 and the wiring materials 142 included in the solar cell panel 100 according to the embodiment of the invention will be described in more detail with reference to FIG. 3. FIG. 3 is a partial cross-sectional view of an example of the solar cell 150 and the wiring materials 142 connected thereto, which are included in the solar cell panel 100 shown in FIG. 1.

Referring to FIG. 3, the solar cell 150 may include a semiconductor substrate 160, a conductive region 20 or 30 formed on or formed at the semiconductor substrate 160, and an electrode 42 or 44 connected to the conductive region 20 or 30. The conductive region 20 or 30 may include a first conductive region 20 having a first conductivity type and a second conductive region 30 having a second conductivity type. The electrode 42 or 44 may include a first electrode 42 connected to the first conductive region 20 and a second electrode 44 connected to the second conductive region 30. Also, the solar cell 150 may further include first and second passivation layers 22 and 32, an anti-reflection layer 24, or the like.

The semiconductor substrate 160 may be formed of a crystalline semiconductor of a single material (e.g., Group 4 element) (e.g., a single-crystalline or polycrystalline semiconductor of a single material, as an example, single-crystalline or polycrystalline silicon, particularly, single-crystalline silicon). The solar cell 150 based on the semiconductor substrate 160 having a high degree of crystallinity and having few defects is excellent in electrical property.

A protruded or indented portion, an uneven portion, or an anti-reflection structure may be formed at a front surface and/or a back surface of the semiconductor substrate 160 by a texturing process. The protruded or indented portion, the uneven portion, or the anti-reflection structure may have a pyramid shape formed of an outer surface formed along a specific crystal plane (e.g., (111) plane) of the semiconductor substrate 160 and having an irregular size. When a surface roughness of the semiconductor substrate 160 is increased due to the protruded or indented portion, the uneven portion, or the anti-reflection structure, reflectance of light incident into the semiconductor substrate 160 can be reduced. However, embodiments of the invention are not limited thereto.

The semiconductor substrate 160 may include a base region 110 having a first or second conductivity type. The base region 110 includes a first or second conductivity type dopant with a relatively low doping concentration lower than a doping concentration of the first or second conductive region 20 or 30. As an example, the base region 110 may have a second conductivity type.

In one example, the first conductive region 20 may form an emitter region that forms a pn junction with the base region 10. The second conductive region 30 may form a back surface field region that forms a back electric field for preventing recombination. In this instance, the first and second conductive regions 20 and 30 may be formed entirely on the front surface and the back surface of the semiconductor substrate 160, respectively. Accordingly, the first and second conductive regions 20 and 30 may be formed with a sufficient area without additional patterning. However, embodiments of the invention are not limited thereto.

In the embodiment, the base region 10 and the conductive regions 20 and 30 constituting the semiconductor substrate 160 have a crystal structure of the semiconductor substrate 160 and have different conductivity types, doping concentrations, or so on. That is, it is exemplified that the conductive regions 20 and 30 are doped regions constituting a part of the semiconductor substrate 160. However, embodiments are not limited thereto. Therefore, at least one of the first conductive region 20 and the second conductive region 30 may be formed of an amorphous, microcrystalline, or polycrystalline semiconductor layer or the like, which is formed on the semiconductor substrate 160 as a separate layer. Other variations are possible.

The first conductivity type dopant included in the first conductive region 20 may be an n-type or a p-type dopant and the second conductivity type dopant included in the base region 10 and the second conductive region 30 may be a p-type or an n-type dopant. As the p-type dopant, Group III element such as boron (B), aluminum (Al), gallium (Ga), indium (In), or so on may be used. As the n-type dopant, Group V element such as phosphorus (P), arsenic (As), bismuth (Bi), antimony (Sb), or so on may be used. The second conductivity type dopant in the base region 10 and the second conductivity type dopant in the second conductive region 30 may be formed of the same material or different materials.

For example, the first conductive region 20 may have a p-type, and the base region 10 and the second conductive region 30 may have an n-type. Then, holes having a slower moving speed than electrons move to a front surface of the semiconductor substrate 160, not a back surface of the semiconductor substrate 160, thereby improving conversion efficiency. However, embodiments are not limited thereto, and an embodiment opposite to the above is also possible.

An insulating layer such as first and second passivation layers 22 and 32 for passivating defects in the conductive regions 20 and 30, an anti-reflection layer 24 for preventing reflection of light, or so on may be formed on surfaces of the semiconductor substrate 160. Such an insulating layer may be formed of an undoped insulating layer which does not include a dopant. The first and second passivation layers 22 and 32 and the anti-reflection layer 24 may be formed substantially on an entire surface of the semiconductor substrate 160 except for a portion corresponding to the first or second electrode 42 or 44 (more particularly, a portion where a first or second opening 102 or 104 is formed).

For example, the passivation layers 22 and 32 or the anti-reflection layer 24 may be formed of a single layer or a multilayer in which two or more layers are combined. The single layer or the multilayer may include at least one of a silicon nitride layer, a silicon nitride layer containing hydrogen, a silicon oxide layer, a silicon oxynitride layer, an aluminum oxide layer, $MgF_2$, $ZnS$, $TiO_2$, and $CeO_2$. For example, the first or second passivation layer 22 or 32 may include a silicon oxide layer having a fixed positive charge, a silicon nitride layer, or the like when the conductive region 20 or 30 have an n-type, or the first or second passivation layer 22 or 32 may include an aluminum oxide layer having a fixed negative charge, or the like when the conductive region 20 or 30 have a p-type. In one example, the anti-reflective layer 24 may include silicon nitride. In addition, a material, a lamination structure, and the like of the insulating layer may be variously modified.

The first electrode 42 is electrically connected to the first conductive region 20 through the first opening 102 and the second electrode 44 is electrically connected to the second conductive region 30 through the second opening 104. For example, the first electrode 42 may be in contact with the first conductive region 20 and the second electrode 44 may be in contact with the second conductive region 30. The first and second electrodes 42 and 44 may be formed of any of various materials (for example, a metal material) and may have any of various shapes. An example of shapes of the first and second electrodes 42 and 44 will be described later.

As described above, in the embodiment, the first and second electrodes 42 and 44 of the solar cell 150 have a certain pattern, and the solar cell 150 receives light from the front surface and the back surface of the semiconductor substrate 160 to have a bi-facial structure. Accordingly, an amount of light used in the solar cell 150 can be increased to contribute to an efficiency improvement of the solar cell 150.

However, embodiments of the invention are not limited thereto, and the second electrode 44 may be formed entirely on the back surface of the semiconductor substrate 160. The first and second conductive regions 20 and 30 and the first and second electrodes 42 and 44 may be positioned together on one surface (e.g., a back surface) of the semiconductor substrate 160. Also, at least one of the first and second conductive regions 20 and 30 may be formed on both surfaces of the semiconductor substrate 160. That is, the solar cell 150 described in the above is merely one example, but embodiments of the invention are not limited thereto.

The solar cell 150 is electrically connected to the neighboring solar cell 150 by a wiring materials 142 positioned on (e.g., in contact with) the first electrode 42 or the second electrode 44. This will be described in more detail with reference to FIG. 4 together with FIGS. 1 to 3.

Figure 4:
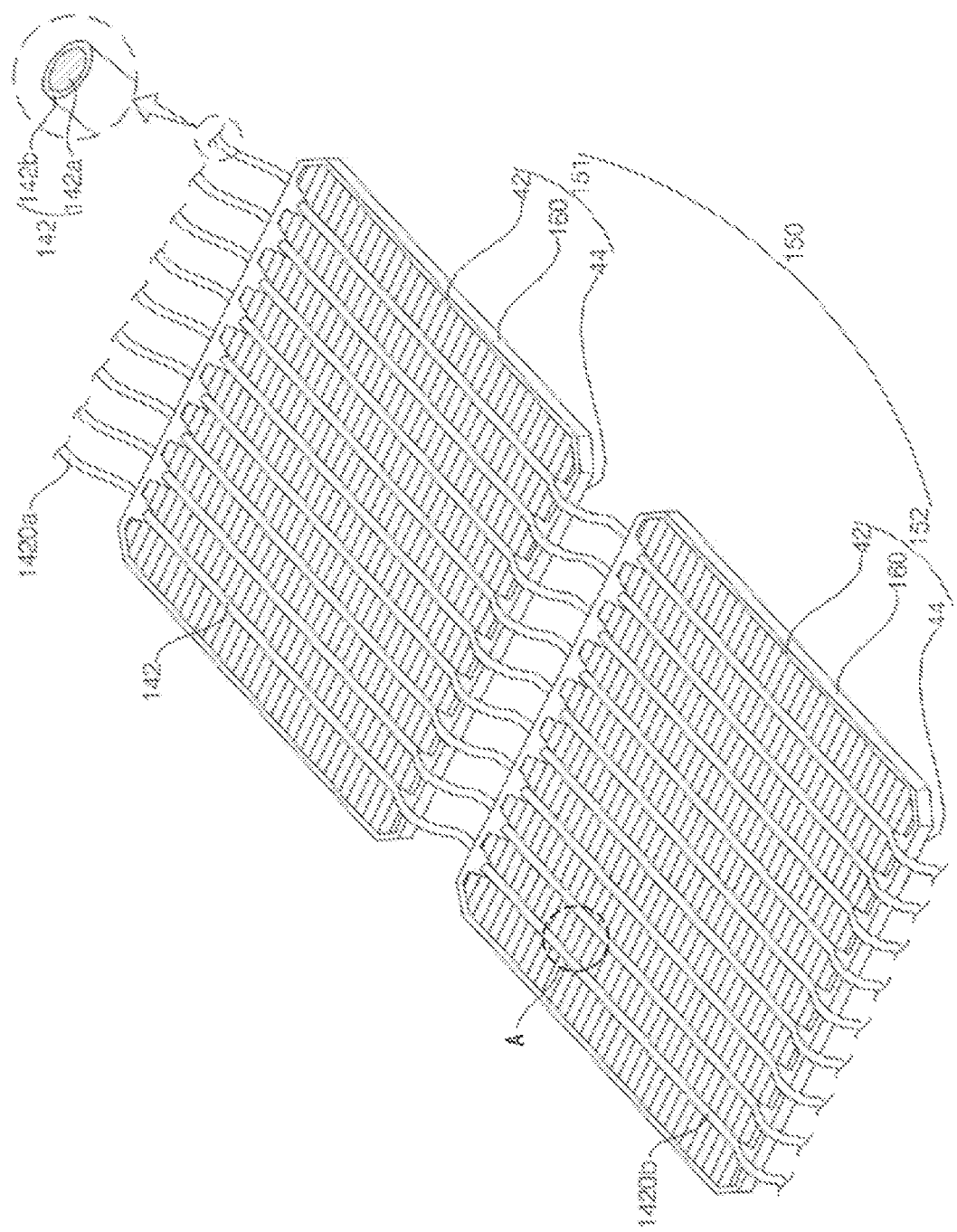
FIG. 4 is a perspective view schematically showing a first solar cell and a second solar cell connected by wiring materials, which are included in the solar cell panel shown in FIG. 1.

FIG. 4 is a perspective view schematically showing a first solar cell 151 and a second solar cell 152 connected by wiring materials 142, which are included in the solar cell panel 100 shown in FIG. 1. A semiconductor substrate 160 and electrodes 42 and 44 of the first and second solar cells 151 and 152 are schematically shown only in FIG. 4 for simplicity and clarity.

As shown in FIG. 4, a wiring material 142 electrically connects a first electrode 42 on a front surface of a first solar cell 151 and a second electrode 44 on a back surface of a second solar cell 152 positioned at one side (a left and lower side in FIG. 4) of the first solar cell 151. Another wiring material 1420*a* electrically connects the second electrode 44 on the back surface of the first solar cell 151 and the first electrode 42 on the front surface of another solar cell, which will be positioned at the other side (a right and upper side in FIG. 4) of the first solar cell 151. Still another wiring material 1420*b* electrically connects the first electrode 42 on the front surface of the second solar cell 152 and the second electrode 44 on the back surface of still another solar cell, which will be positioned at the one side (a left and lower side in FIG. 4) of the second solar cell 152. Accordingly, the plurality of solar cells 150 can be connected to each other by the wiring materials 142, 1420*a*, and 1420*b*. The description of the wiring material 142 may be applied to the wiring materials 142, 1420*a*, and 1420*b* that connect two adjacent solar cells 150 to each other.

In this instance, a plurality of wiring materials 142 are provided on one surface of each solar cell 150 and the plurality of wiring materials 142 extend in a direction, and thus, an electrical connection property of two adjacent solar cells 150 can be enhanced. In particular, in the embodiment, each wiring material 142 is constituted by a wire having a smaller width than a ribbon having a relatively great width (e.g., 1 to 2 mm), which has been used in the related art. Thus, a large number of wiring materials 142, which is greater than a number of ribbons (e.g., two to five) has been used in the related art, may be used with respect to one surface of each solar cell 150.

For example, the wiring material 142 may have a width (or diameter) of 100 µm to 500 µm (for example, 250 µm to 450 µm, particularly, 300 µm to 400 µm). For reference, a solder layer 142*b* has a very small thickness and may have various thicknesses depending on a position at the wiring material 142. Thus, a width of the wiring material 142 may be a width of a core layer 142*a* or a width of the wiring material 142 passing through a center of the wiring material 142. When the wiring material 142 has the above width, the wiring material 142 can effectively transmits current, an adhesion property with the solar cell 150 can be improved, and light loss can be effectively prevented. A number of the wiring materials 142 with respect to one surface of the solar cell may be 6 to 33 (for example, 8 to 33, as an example, 10 to 33, particularly 10 to 15). The plurality of wiring materials 142 may be spaced from each other with a uniform interval to have a symmetrical shape. Since a number of the wiring materials 142 can be sufficiently secured, the current can be effectively transmitted while optical loss can be prevented by the small width of the wiring material.

A wire constituting the wiring material 142 may have a circular, oval, or curved cross-section, a rounded shape, or a rounded cross-section. Alternatively, a wire constituting the wiring material 142 may have a polygonal cross-section (for example, a rectangular cross-section) having a predetermined width and a predetermined height, which are similar to each other. Accordingly, the wiring material 142 induces reflection or diffuse reflection, and the light reflected by the wiring material 142 can be re-incident on the solar cell 150 and reused.

In one example, each wiring material 142 includes a core layer 142*a*, and a solder layer 142*b* coated on an outer surface of the core layer 142*a* with a small thickness. The solder layer 142*b* may include a solder material for soldering the wiring material 142 and the electrodes 42 and 44. For example, the core layer 142*a* may include Ni, Cu, Ag, or Al as a major material (e.g., a material having a content of 50 wt % or more, in more detail, a material having a content of 90 wt % or more). The solder layer 142*b* may include a material such as Pb, Sn, SnIn, SnBi, SnPb, SnPbAg, SnCuAg or SnCu as a major material. However, embodiments of the invention are not limited to the above-described materials, and thus, the core layer 142*a* and the solder layer 142*b* may include any of various materials.

However, embodiments are not limited to a width, a number, and a shape of the wiring material 142 described above.

Figure 5:
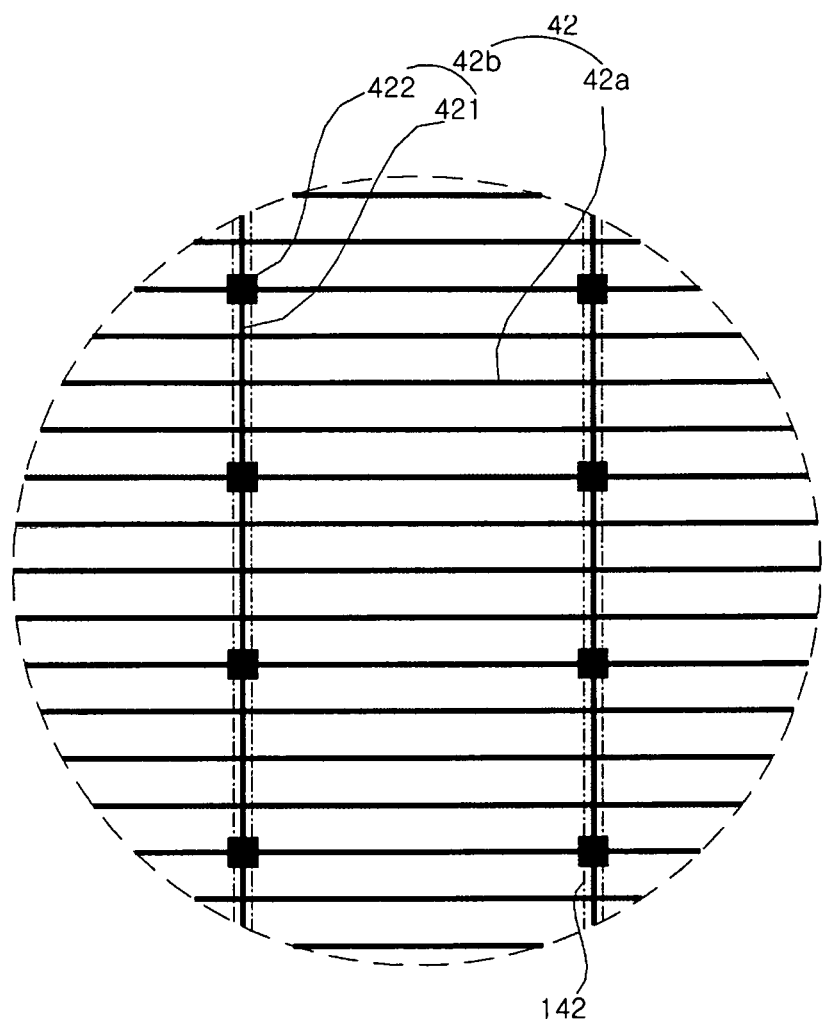
FIG. 5 is an enlarged partial plan view of portion A in FIG. 4.

An example of the electrodes 42 and 44 of the solar cell 150 where the wiring materials 142 may be attached, according to the embodiment of the invention, will be described in more detail with reference to FIG. 5 together with FIGS. 1 to 4. Hereinafter, an illustration and a description of the electrodes 42 and 44 will be given in conjunction with the first electrode 42 with reference to FIG. 5 first, and then, the second electrode 44 will be described. FIG. 5 is an enlarged partial plan view of portion A in FIG. 4.

Referring to FIGS. 1 to 5, in the embodiment, the first electrode 42 includes a plurality of finger lines 42*a* extending in a first direction (a horizontal direction in the drawing) to be parallel to each other. The first electrode 42 may further include a bus bar line 42*b* extending in a second direction (a vertical direction in the drawing) crossing (for example, perpendicular to) the finger line 42*a*. The wiring material 142 may be connected or attached to the bus bar line 42*b*. Since the bus bar lines 42*b* may be arranged in an one-to-one correspondence with the wiring materials 142, the description of a number of the wiring materials 142 and the like may be directly applied to a number of the bus bar lines 42*b* and the like.

The bus bar line 42*b* may include a line portion 421 and a pad portion 422. The line portion 42*a* may extend in a direction in which the wiring material 142 extends and have a relatively narrow width. The pad portion 422 may have a width wider than the line portion 421, and may be a portion where the wire material 142 substantially connected. Optical loss can be minimized by the line portion 421, and an adhesion force with the wiring material 142 can be increased and contact resistance can be decreased by the pad portion 422. The line portion 421 may provide a path through which carriers bypass when some finger lines 42*a* are broken or damaged.

A width of the pad portion 422 in the first direction may be greater than a width of the line portion 421 in the first direction and a width of the finger line 42*a* in the second direction. A length of the pad portion 422 in the second direction may be greater than a width of the line portion 421 in the first direction and a width of the finger line 42*a* in the second direction. A width of the line portion 421 may be the same as or smaller than a width of the wiring material 142 and a width of the pad portion 422 may be the same as or larger than a width of the wiring material 142. As described above, when the pad portion 422 has a sufficient width, an adhesion force with the wiring material 142 can be improved and contact resistance can be reduced. A width of the wiring material 142 may be smaller than a pitch of the finger lines 42a. However, embodiments are not limited thereto and various modifications are possible.

In one bus bar line 42b, 6 to 24 (for example, 12 to 22) of pad portions 422 may be arranged at regular intervals. In one example, the pad portion 422 may be positioned one by one for every two to ten finger lines 42a. However, a number, an arrangement, and the like of the pad portions 422 may be variously modified. For example, a number and a density of the pad portions 422 may be increased at a portion where a large force acts.

In the above description, the first electrode 42 is mainly described with reference to FIG. 5. The second electrode 44 may include a finger line and a bus bar line corresponding to the finger line 42a and the bus bar line 42b of the first electrode 42, respectively. The description of the first electrode 42 may be applied to the second electrode 44 as it is. In this instance, a width or a number of the finger lines 42a, and the line portion 421 and the pad portions 442 of the bus bar line 42b may be the same or may be different in the first electrode 42 and the second electrode 44.

According to the embodiment, optical loss can be minimized by diffused reflection or the like using a wiring material 142 of a wire shape, and a movement path of carrier can be reduced by increasing a number of wiring materials 142 and reducing pitches of the wiring material 142. In addition, a width or diameter of the wiring material 142 is reduced, and thus, material cost can be greatly reduced. Thus, efficiency of the solar cell 150 and output of the solar cell panel 100 can be improved.

When the wiring material 142 of the wire shape according to the embodiment is used as an interconnector, a contact area of the wiring material 142 with the solar cell 150 may not large due to a cross-sectional shape of the wiring material 142 such as a circular shape, and thus, an adhesion property may be deteriorated. Also, it may be difficult to simplify a process because the wiring materials 142 may not easily move together. An apparatus for attaching an interconnector (an apparatus for attaching a wiring material) according to the embodiment and a method for attaching an interconnector (a method for attaching a wiring material) using the same will be described in detail with reference to FIGS. 6 to 11.

Figure 6:
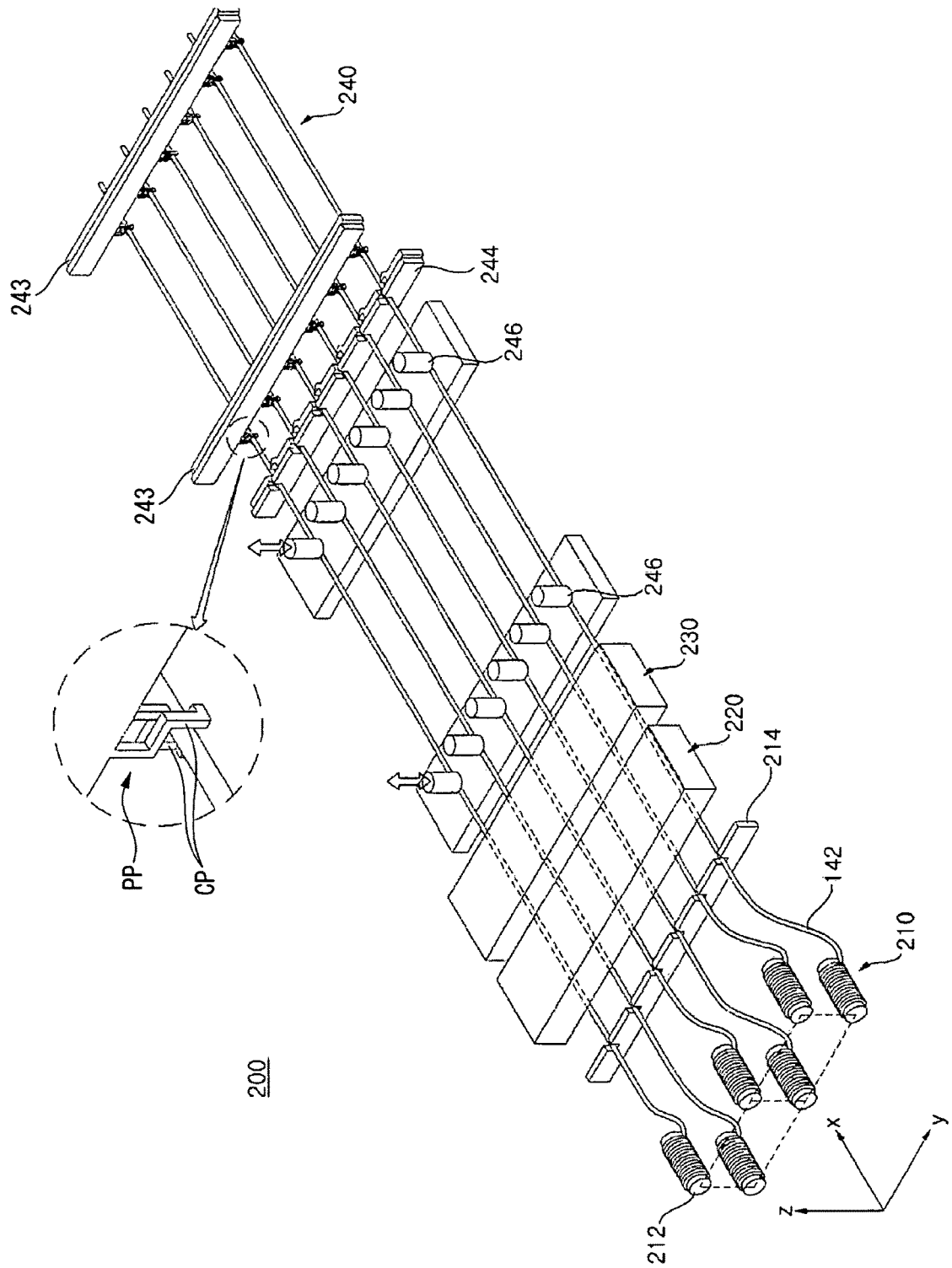
FIG. 6 is a schematic view showing a part of an apparatus for attaching an interconnector of a solar cell panel according to an embodiment of the invention.
Figure 7:
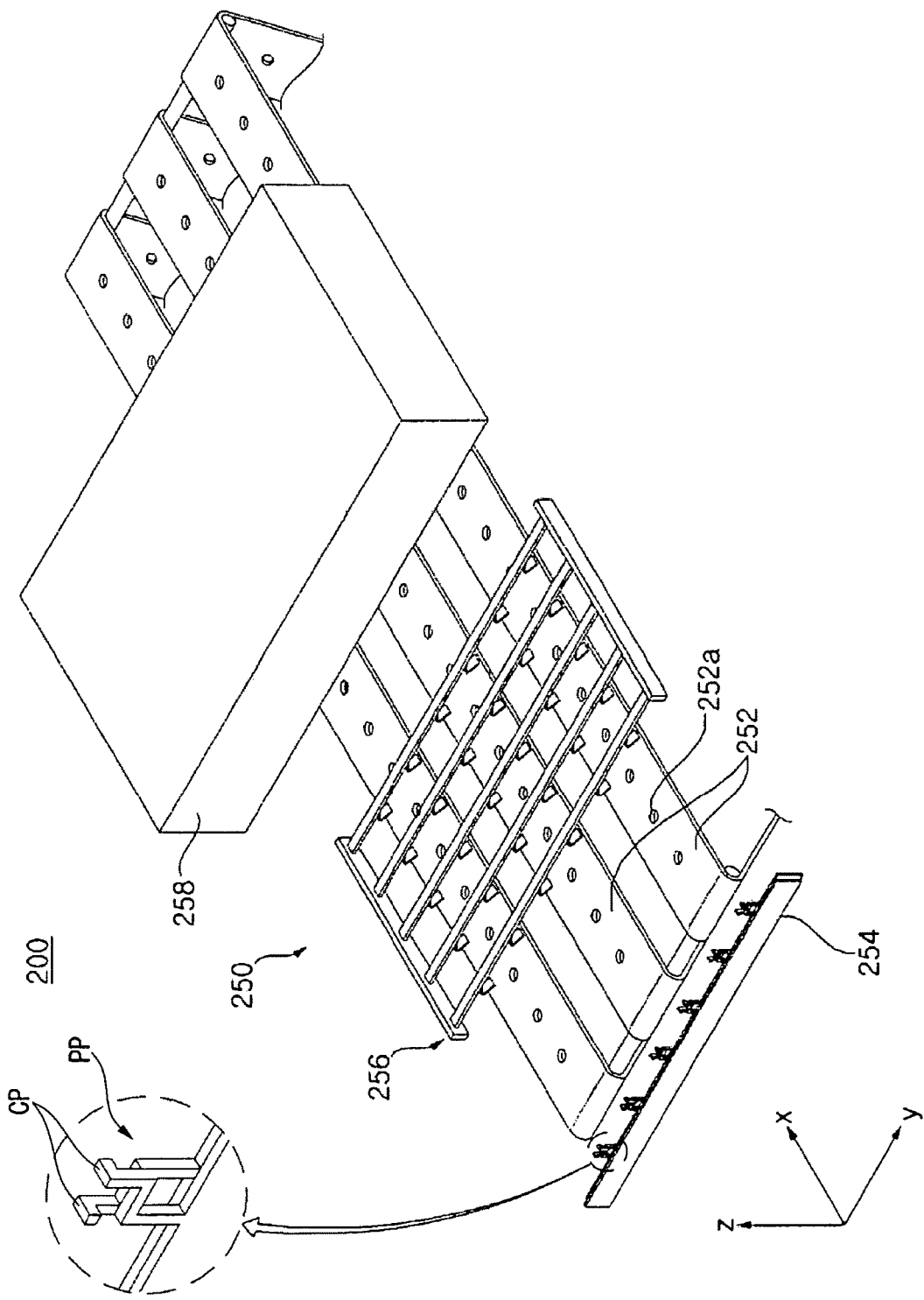
FIG. 7 is a schematic view showing another part of an apparatus for attaching an interconnector of a solar cell panel according to an embodiment of the invention.

FIG. 6 is a schematic view showing a part of an apparatus for attaching an interconnector of a solar cell panel according to an embodiment of the invention. FIG. 7 is a schematic view showing another part of an apparatus for attaching an interconnector of a solar cell panel according to an embodiment of the invention. Hereinafter, portions related to the embodiment will be described in detail and the detailed description of portions not directly related to the embodiment will be omitted.

Referring to FIGS. 6 and 7, an apparatus for attaching an interconnector to a solar cell panel (hereinafter, referred to as "an interconnector attaching apparatus") 200 according to the embodiment includes a wiring-material supply portion (an interconnector supply portion) 210, a flux portion (a flux coating device) 220, a drying portion 230, a wiring-material transfer portion (an interconnector transfer portion) 240, and an attaching portion 250. The wiring-material supply portion 210 unwinds a wiring material 142 wound around a winding roll 212 and supplies the wiring material 142 in a process direction. The flux portion 220 coats or applies a flux 220a (see FIG. 8) on the supplied wiring material 142. The drying portion 230 is positioned after the flux portion 220 in a process direction and dries the flux 220a or a flux layer 220c (see FIG. 8). The wiring-material transfer portion 240 is positioned after a cutting portion 244 in a process direction and fixes and moves the wiring material 142. The attaching portion 250 attaches the wiring material 142 to the solar cell 150. This will be described in more detail.

A plurality of wiring materials 142 unwound from a plurality of winding rolls 212 move in a state in which they are arranged in parallel by a guide portion 214. Thus, processes necessary to the wiring materials 142, which will be attached to one surface of each solar cell 150, can be simultaneously performed to the plurality of wiring materials 142, and thus, the plurality of wiring materials 142 can be attached to one surface of each solar cell 150 at the same time, Thus, a process can be simplified. However, embodiments are not limited thereto and various modifications are possible.

The aligned plurality of wiring materials 142 pass through the flux portion 220. In the flux portion 220, a flux 220a is applied or coated on an outer surface of the wiring material 142 to form a flux layer 220c. The flux 220a prevents a metal material of the wiring material 142 or the electrodes 42 and 44 from being oxidized or an oxide layer formed on an outer surface of the wiring material 142 is removed when the wiring material 142 is attached to the solar cell 150, thereby improving an adhesion property. The flux 220a may include a solution containing a solvent and an organic acid. Then, the oxide layer formed on the outer surface of the wiring material 142 can be easily removed.

In the embodiment, the flux 220a may be applied or coated on the outer surface of the wiring material 142 to form the flux layer 220c by a dipping process without a change in a route. This will be described later in detail with reference to FIGS. 8 to 11.

The flux 220a or the flux layer 220c applied or coated on the wiring material 142 by the flux portion 220 is dried while passing through the drying portion 230 so that the flux layer 220c surrounds an outer circumferential surface of the wiring material 142. A thickness of the flux layer 220c may be 2 μm to 7 μm. Within the above range of the thickness, an oxide positioned on a surface of the wiring material 142 can be effectively removed to improve a bonding property between the wiring material 142 and the solar cell 150. However, embodiments are not limited thereto, and a thickness of the flux layer 220c may have a different value.

The drying portion 230 may have any of various structures for drying the flux 220a. For example, the drying portion 230 may dry the flux 220a by wind, heat, or the like. Embodiments are not limited to a structure, a method, a type, and the like of the drying portion 230.

The wiring materials 142 that have passed through the drying portion 230 are fixed by a jig 243 of the wiring-material transfer member 240, are cut by a cutting portion 244, and are transferred to the attaching portion 250 or a work table 252 where the wiring materials 142 and the solar cell 150 are attached each other. As the jig 243, any of various structures capable of fixing a plurality of wiring materials 142 may be applied. For example, each of jigs 243 may have a plurality of protruding portions PP each having a clamp portion CP into which one wiring material 142 is inserted, and thus, a plurality of wiring materials 142 may correspond one-to-one to a plurality of protruding portions PP or a plurality of clamp portions CP. As a result, the plurality of wiring materials 142 can be stably fixed at a desired position. A structure of the jig 243, a structure of the clamp portion CP, and a structure of the protruding portion PP may be variously modified. Thus, embodiments are not limited to the above.

In this instance, jigs 243 are positioned at both ends of the plurality of wiring materials 142 to hold the plurality of wiring materials 142 in a state that the plurality of wiring materials 142 are stretched. Thus, the plurality of wiring materials 142 can be stably fixed and moved. Since the plurality of wiring materials 142 are formed of a wire having a small width, when the plurality of wiring materials 142 are maintained in a stretched state, the plurality of wiring materials 142 are plastically deformed and thus become in a state of being not deformed any more. The plurality of wiring materials 142 can be maintained to have constant yield strength by a simple structure.

Any of various structures may be applied to the structure of the cutting portion 244. A fixing member 246 may be further included. The fixing member is positioned before the cutting portion 244 in a process direction and fixes the wiring materials 142 at the time of cutting. The fixing member 246 may have any of various structures.

The attaching portion 250 attaches the wiring materials 142 to the solar cell 150 by applying heat by a heat source portion 258 while pressing and fixing the wiring materials 142 and the solar cell 150. In the embodiment, the jig 243 is separated from the wiring materials 142 after the wiring materials 142 and the solar cell 150 are fixed to each other by an exhaust adsorption at a work table 252 and an upper fixing member 256. The wiring materials 142 and the solar cell 150 are allowed to pass through the heat source portion 258 without the jig 243. For example, the work table 252 may include a conveyor belt having an exhaust hole 252a, and the upper fixing member 256 may have any of various structures (for example, a structure having an elastic member) that can press the solar cell 150 and the wiring members 142 from an upper portion and fix the solar cell 150 and the wiring members 142.

In order to prevent a position of the wiring materials 142 and the solar cell 150 from being undesirably shifted when the wiring materials 142 and the solar cell 150 are fixed using the exhaust absorption, a fixing member 254 may be positioned at one side of the work table 252 (before a portion where the work table 252 starts). The fixing member 254 may have any of various structures, types, and systems that can fix or move the plurality of wiring materials 142 at a predetermined position. For example, the fixing member 254 has a structure similar to that of the jig 243, but includes protruding portions PP each having a clamp portion CP protruding upward. The heat source portion 258 provides heat to the solar cell 150 from an upper portion or a lower portion of the work table 252. The solder layer 142b of the wiring material 142 is melted and soldered by the heat provided by the heat source portion 258 and thus the wiring material 142 may be attached to the electrodes 42 and 44 (particularly, the pad portions 424) of the solar cell 150. In the embodiment, the heat may be directly applied by the heat source portion 258, thereby reducing a time of the attaching process and improving an adhesion property. For example, the heat source portion 258 may include an infrared lamp. However, embodiments are not limited thereto and any of structures, types, systems, and the like that can provide heat may be applied to the heat source portion 258.

Hereinafter, the flux portion 220 according to the embodiment will be described in more detail with reference to FIGS. 8 to 11.

Figure 8:
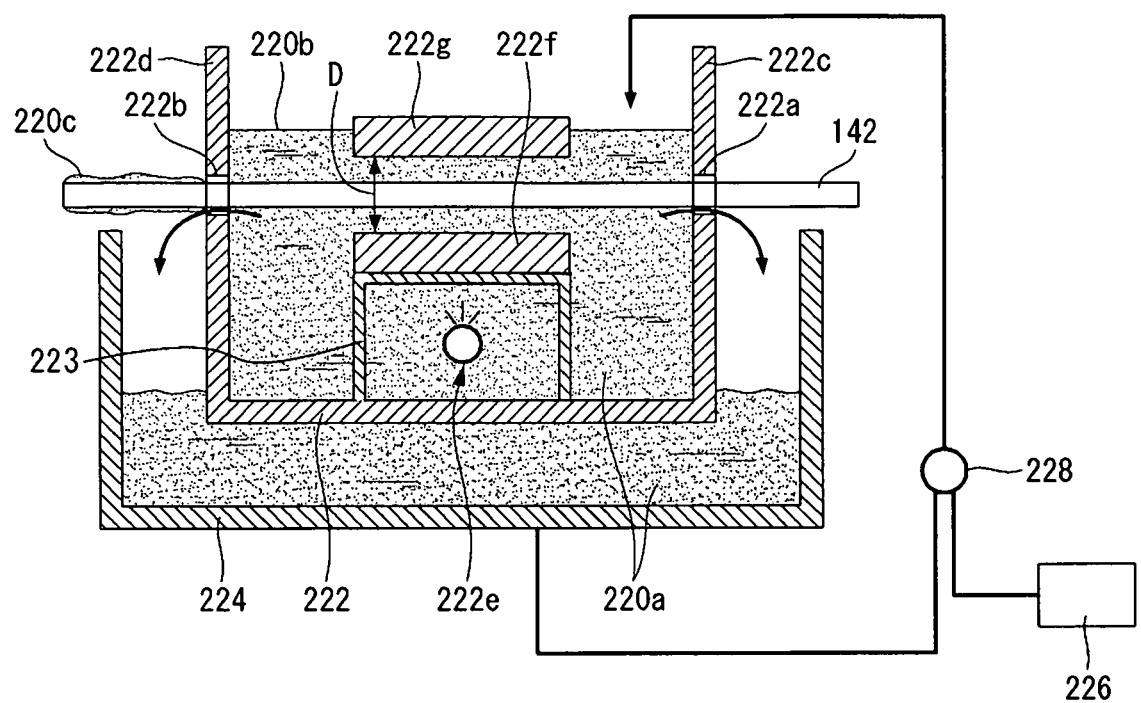
FIG. 8 is a schematic view showing a flux portion included in the apparatus for attaching the interconnector of the solar cell panel shown in FIG. 6.
Figure 9:
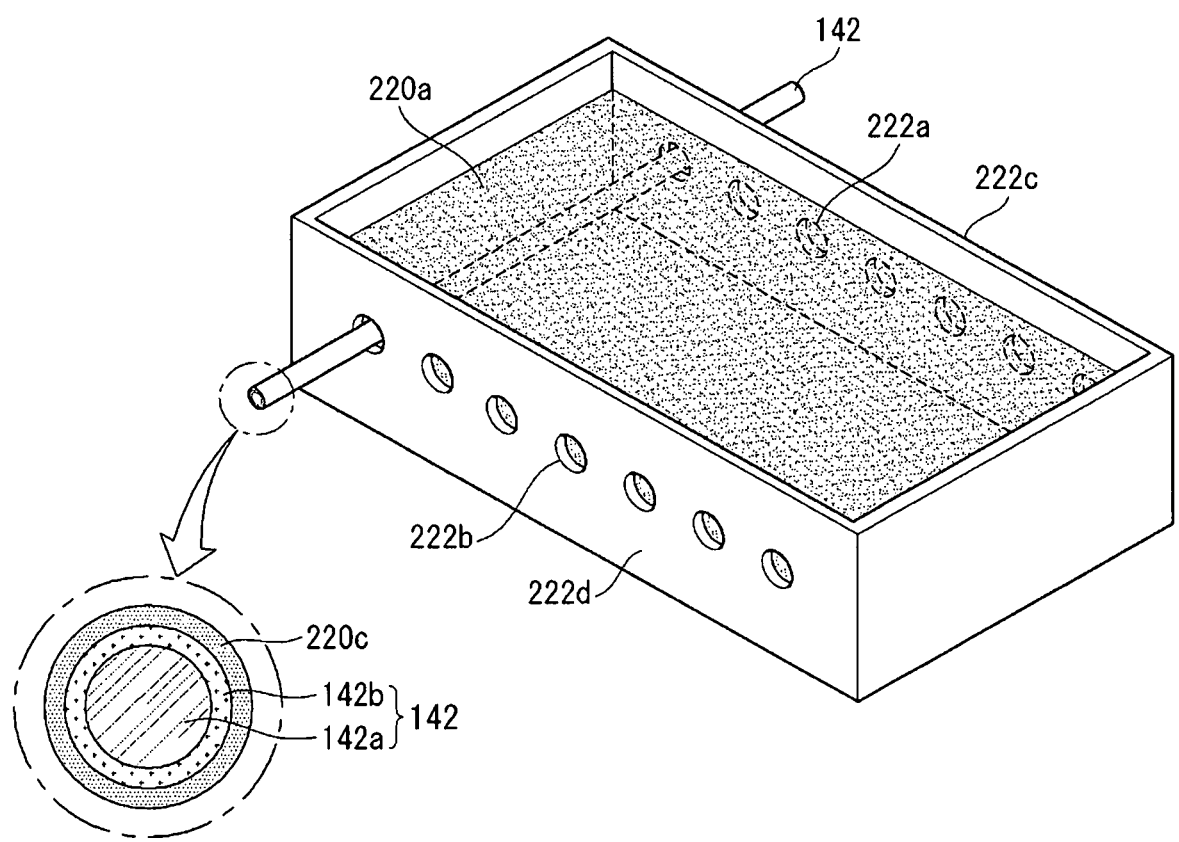
FIG. 9 is a schematic view showing a flux bath included in the flux portion and a wiring material passing through the flux bath, which are shown in FIG. 8.
Figure 10:
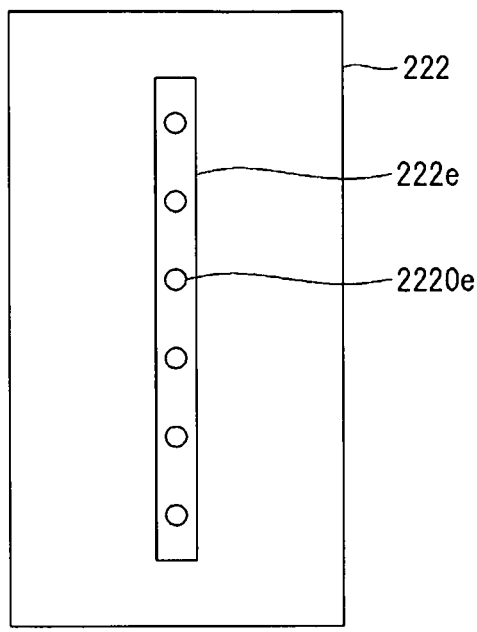
FIG. 10 is a top plan view showing the flux bath included in the flux portion shown in FIG. 8.

FIG. 8 is a schematic view showing the flux portion 220 included in the interconnector attaching apparatus 200 of the solar cell panel 100 shown in FIG. 6, and FIG. 9 is a schematic view showing a flux bath 222 included in the flux portion 220 and the wiring material 142 passing through the flux bath 222, which are shown in FIG. 8. FIG. 10 is a top plan view showing the flux bath 222 included in the flux portion 220 shown in FIG. 8.

Referring to FIGS. 8 to 10, a flux portion 220 according to the embodiment includes a flux bath 222 for receiving a flux 220a, and the flux portion 220 has an inlet 222a and an outlet 222b configured to allow a wiring material 142 to pass below a surface (that is, an upper surface) 220b of the flux 220a. More particularly, the inlet 222a is formed at a first surface 222c of the flux bath 222, the outlet 222b is formed at second surface 222d of the flux bath 222 opposite to the first surface 222c of the flux bath 222, and at least a part of the inlet 222a and at least a part of the outlet 222b may be positioned below the surface 220b of the flux 220a. That is, in the flux portion 220, the wiring material 142 may move without a change in a route from the inlet 222a to the outlet 222b below the surface 220b of the flux 220a (i.e., inside the flux 220a). In this instance, the phrase of "the wiring material 142 moves without the change in the route" may mean a case that the wiring material 142 is directed from the inlet 222a to the outlet 222b along a straight path or a linear path without bending of the wiring material 142 from the inlet 222a to the outlet 222b. That is, a separate guide roller or the like for changing a route or a path of the wiring material 142 is not provided in the flux bath 222 or in the flux portion 220, and thus, the wiring material 142 can move in a straight path or a linear path from the inlet 222a to the outlet 222b.

In the embodiment, a plurality of inlets 222a are arranged at the same height at the first surface 222c and may be provided in parallel with each other, and a plurality of outlets 222b are arranged at the second surface 222d at the same height and may be provided in parallel with each other. In this instance, a number of the plurality of inlets 222a may be the same as a number of the plurality of the wiring materials 142, and a number of the plurality of outlets 222b may be the same as a number of the plurality of the wiring materials 142. However, embodiments are not limited to this, and the number of the inlets 222a or the number of the outlets 222b may be larger than the number of the wiring materials 142 so that the wiring materials 142 pass through some inlets 222a or some outlets 222b. In a direction perpendicular to the wiring material 142, pitches of the plurality of inlets 222a (i.e., distances between centers of the inlets 222a) positioned side by side and pitches of the plurality of outlets 222b (i.e., distances between centers of the outlets 222b) positioned side by side are the same as or greatly similar to (e.g., within 10% tolerance) pitches of the wiring materials 142 (that is, the distance between centers of the wiring materials 142). Thus, each wiring material 142 may pass through the inlet 222a and the outlet 222b in an one-to-one correspondence. Then, the flux 220a can be applied or coated on the plurality of wiring materials 142 at the same time in a state that the plurality of wiring materials 142 are arranged side by side at regular pitches or intervals by moving the wiring materials 142 arranged side by side at regular pitches and passing through the plurality of inlets 222a spaced apart from each other at regular pitches and the plurality of outlets 222b spaced apart from each other at regular pitches. Thus, a process can be simplified. For example, the pitch of the inlets 222a and the outlets 222b of the flux bath 222 or the pitch of the plurality of wiring materials 142 passing through the inlets 222a and the outlets 222b of the flux bath 222 may be the same as or very similar to (e.g., within 10% tolerance) the pitch of the plurality of wiring materials 142 attached to the solar cell 150. Accordingly, the plurality of wiring materials 142 passing through the flux bath 222 can be moved and be attached to the solar cell 150 as they are without adjusting or changing pitches or intervals.

In this instance, the plurality of inlets 222a and the plurality of outlets 222b may be positioned at the same height with each other. Then, the wiring material 142 moves horizontally with or parallel to the bottom surface or the ground, thereby improving stability of a movement of the wiring materials 142 and being able to coating or applying the flux 220a uniformly to an entire surface of the wiring material 142. However, embodiments are not limited thereto.

Thus, in this embodiment, the flux 220a is applied or coated on the wiring material 142 by a dipping process without a change in a route. In this instance, a plurality of wiring materials 142 positioned side by side at a regular interval at the same height pass through the plurality of inlets 222a at the same time in an one-to-one correspondence with the plurality of inlets 222a, pass through an inside of the flux 220a, and pass through the plurality of outlets 222b at the same time in an one-to-one correspondence with the plurality of outlets 222b. Then, the flux 220a can be applied or coated at the same time on the plurality of wiring materials 142 that will be attached to one surface of one solar cell 150 together. Thus, a process can be simplified.

For example, as shown in FIG. 9, the inlet 222a or the outlet 222b may be formed of a hole formed at the first surface 222c or at the second surface 222d of the flux bath 222 below the surface 220b of the flux 220a. Then, a whole portion of the hole is positioned below the surface 220b of the flux 220a. Thus, the wiring material 142 moves through the inlet 222a and the outlet 222b, the wiring material 142 can stably move below the surface 222b of the flux 220a inside the flux 220a. In this instance, when a front end of the wiring material 142 is positioned at the inlet 222a, the wiring material 142 is pushed from a rear side of the wiring material 142 and the wiring material 142 passes through the inlet 222a and then the outlet 222b, and thereafter, the wiring material 142 may move in a desired direction by fixing the wiring material 142 again at a side of the outlet 222b.

Figure 11:
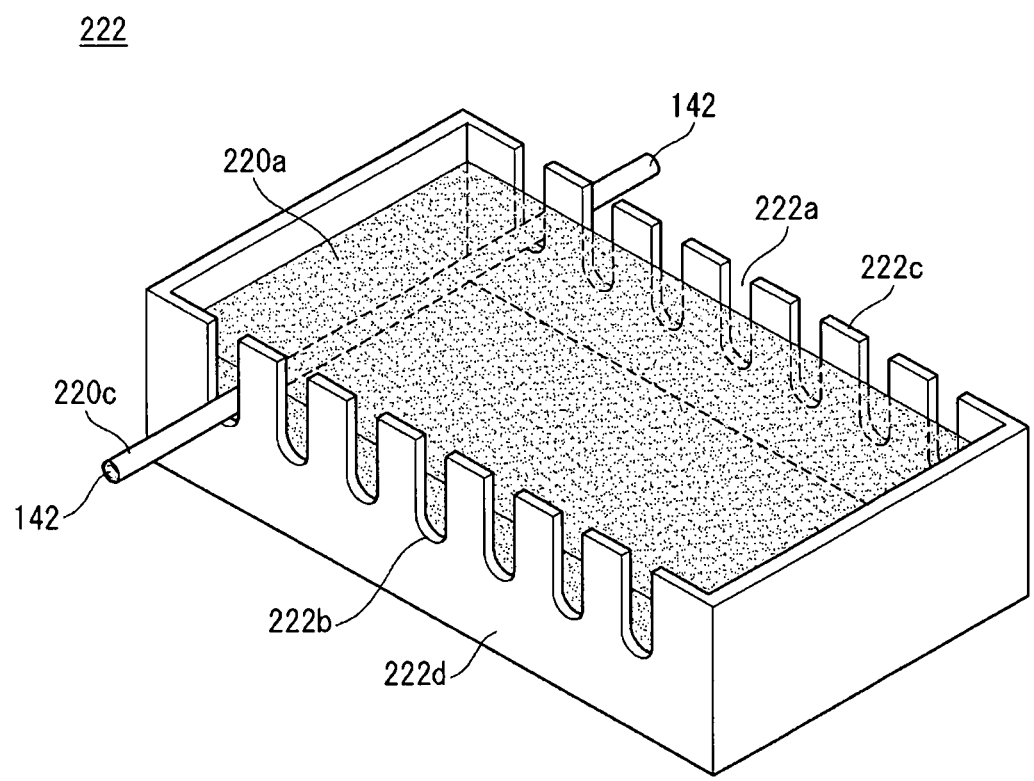
FIG. 11 is a schematic view showing a flux bath included in a flux portion of an apparatus for attaching an interconnector of a solar cell panel according to a modified embodiment of the invention.

As a modified embodiment, as shown in FIG. 11, an inlet 222a and an outlet 222b may be formed so as to extend from an upper portion of a first surface 222c or a second surface 222d of a flux bath 222. The inlet 222a or the outlet 222b may have a shape that extends below the surface 220b of the flux 220a from an upper portion of the flux bath 222 and thus has an open upper portion. With such a structure, a device or member (not shown, for example, a device or member having a structure similar to that of the jig 243) for fixing wiring materials 142 is connected or coupled to the wiring materials 142, the device or member for fixing the wiring materials and the wiring materials 142 fixed thereto pass through the inlet 222a and the outlet 222b together. Then, since the device or member for fixing the wiring materials 142 and the wiring materials 142 connected or coupled to thereto together can be passed through the flux bath 222, the movement of the wiring materials 142 can be stably performed and a structure and the like for moving the wiring materials 142 can be simplified.

In this instance, each of a width or diameter of the inlet 222a and a width or diameter of the outlet 222b may be larger than a width or diameter of the wiring material 142. Then, the wiring material 142 can move in a non-contact state with the flux portion 220 or the flux bath 222. This can effectively prevent problems that unwanted damage to the wiring material 142 is induced or that the flux 220a is not sufficiently applied or coated on a part of the wiring material 142.

Referring again to FIGS. 8 to 10, in the embodiment, a supplying member (a spouting member) 222e for supplying, jetting, spraying, ejecting, or spouting the flux 220a upward may be positioned at a lower portion inside the flux bath 222. For example, the supplying member (the spouting member) 222e may generate bubbles or the like to supply, jet, or spray the flux 220a upward. The supplying member 222e supplies, jets, or sprays the flux 220a upward at a predetermined time interval or continuously so that the surface 220b of the flux 220a maintains a higher level or aids to maintain a higher level than lower portions of the inlets 222a and the outlets 222b. In the embodiment, a separate structure that closes the inlet 222a and the outlet 222b of the flux bath 222 from outside is not included, and thus, the flux 220a easily flows to an outside of the flux bath 222 through the inlet 222a and the outlet 222b. Thus, it is possible to prevent a level of the flux 220a from being lower than a position of the wiring material 142 by providing the flux 220a by the supplying member 222e. Thus, in the embodiment, the supplying member 222e allows the flux 220a to maintain a sufficient water level in the structure having the inlets 222a and the outlets 222b.

In this instance, the supplying member 222e may operate only when the wiring material 142 passes, and the flux 220a may be circulated only when the wiring material 142 passes through the flux 220a. When the wiring material 142 is not passed through the flux 220a, the supplying member 222e is not operated, and then, the flux 220a is not circulated but positioned only inside the flux bath 222. The vaporization phenomenon, which may occur undesirably when the flux 220a circulates, can be minimized.

A supplying port (a spouting hole) 2220e for supplying, jetting, spraying, ejecting, or spouting the flux 220a upward may be formed at an upper portion of the supplying member 222e, and an inflow port (not shown) may be formed at a lower portion of the supplying member 222e to draw the flux 220a in the flux bath 222 and supply the flux 220a through the supplying port 2220e. For example, the bubbles or the like may be supplied to through the supplying port (the spouting hole) 2220e to supply, jet, spray, or spout the flux 220a upward. The supplying member 222e may be provided with a separate member (for example, a pump or the like) (not shown) for applying pressure to the flux 220a introduced into the inflow port. Any of various structures, systems, methods, types, or the like known as a structure, a system, a method, a type, or the like in which the flux 220a is supplied, jetted, sprayed, or ejected upward through the supplying port 2220e may be applied.

In FIG. 10, for example, it is illustrated that the supplying member 222e has a shape longitudinally extending at a lower center of the flux bath 222, and has a plurality of supplying ports 2220e at regular intervals in a longitudinal direction of the supplying member 222e. Then, the flux 220a can be stably and effectively supplied upward so that the surface 220b of the flux 220a has a desired level. However, embodiments are not limited thereto, and a shape, a structure, or the like of the supplying member 220a and a position, a shape, or the like of the supplying member 2220e may be variously modified.

A coating-amount control portion may be further provided in a movement path of the wiring material 142 in the flux bath 222 to adjust an amount of the flux 220a applied or coated on the wiring material 142. The coating-amount control portion may be provided so as to be in close contact with an upper side and a lower side of the wiring material 142, respectively. For example, the coating-amount control portion may include a lower control member (a lower coating-amount control portion) 222f positioned at a lower portion of the movement path of the wiring material 142, and an upper fixing member 222g positioned at an upper portion of the movement path of the wiring material 142.

The lower control member 222f is fixed to a lower surface or a side surface of the flux bath 222 to control a coating amount of the flux 220a to be applied or coated on the wiring material 142 and to prevent the wiring material 142 from being hung down. For example, since the lower control member 222f is located inside the flux bath 222, a fixing support member 223 may be provided inside the flux bath 222 to support the lower control member 222f. For example, the fixing support member 223 may be fixed to a lower inner surface of the flux bath 222, and the lower control member 222f may be fixed and supported (e.g., in contact with) by the fixed support member 223 on the fixing support member 223. By the fixing support member 223, the lower control member 222f can withstand a force applied to the lower control member 222f downward by the upper fixing member 222g. The fixing support member 223 may be positioned at a position where the supplying port 2220e is not located so as not to obstruct the flow of the flux 220a ejected by the supplying port 2220e. Any of various structures, various types, various methods, and the like known as the fixing support member 223 may be applied. In FIG. 8, it is exemplified that the fixing support member 223 includes a support portion, which supports the lower control member 222f at a lower portion of the lower control member 222f in a cross-section perpendicular to a longitudinal direction of the supplying member 222e, and extended portions, which are extended from at both side of the lower portion to the lower inner surface of the flux bath 222, respectively. For example, the support portion may have the same or larger size, width, or length as the lower control member 222f, and an entire portion of the lower control member 222f may be positioned on the fixing support member 223. One or a plurality of fixing support members 223 may be positioned between the supplying ports 2220e or outside the supplying ports 2220e in a longitudinal direction of the supplying member 220e. However, embodiments of the present invention are not limited thereto. For example, the fixing support member 223 includes a support portion, which supports the lower control member 222f at a lower portion of the lower control member 222f in a cross-section perpendicular to a longitudinal direction of the wiring material 142 or a process direction, and extended portions, which are extended from at both side of the lower portion to the lower inner surface of the flux bath 222, respectively. In this instance, one or a plurality of fixing support members 223 may be positioned at a position apart from the supplying member 220e or the supplying port 2220e in a direction crossing a longitudinal direction of the supplying member 220e. The upper fixing member 222g may be positioned in a floated state on the flux 220a to be positioned at inside and outside of the flux 220a so as to move the wiring material 142 only at the inside of the flux 220a and to control the coating amount of the flux 220a. Further, it is possible to prevent excessive coating of the flux 220a by adjusting a distance D between the lower control member 222f and the upper fixing member 222g. The lower control member 222f and the upper fixing member 222g may be formed of a material (i.e., a non-absorbent material) that does not absorb the flux 220a. For example, the lower control member 222f may be formed of a hard sponge, a metal bar, or so on and the upper fixing member 222g may be formed of a hard sponge, a metal bar, or so on having a specific gravity smaller than that of the flux 220a. As a result, when the wiring material 142 is moved, unwanted increase in a gap between the lower control member 222f and the upper fixing member 222g or unwanted increase in a discharge amount or a coating amount of the flux 220a, which may be induced due to vibration of the wiring material 142, can be prevented. Abrasion, damage, or friction of the wiring material 142, which may be induced when the wiring material 142 moves if the lower control member 222f or the upper fixing member 222g has high strength, can be prevented.

In this instance, a distance D between the lower control member 222f and the upper fixing member 222g may be larger than a thickness or a diameter of the wiring material 142. Then, the wiring material 142 can be maintained in a non-contact state with the lower control member 222f and the upper fixing member 222g so that the flux 220a can be sufficiently applied or coated on the wiring material 142. Alternatively, a distance D between the lower control member 222f and the upper fixing member 222g may be equal to a thickness or a diameter of the wiring material 142. Then, the wiring material 142 can moves in a correct movement path without disturbing the coating of the flux 220a on the wiring material 142. Even when the wiring material 142 contacts the lower control member 222f and the upper fixing member 222g, the lower control member 222f and the upper fixing member 222g do not provide tensile force or the like to the wiring material 142, and thus do not disturb the coating of the flux 220a on the wiring material 142 at the corresponding portion. However, embodiments are not limited thereto. Thus, a distance D between the lower control member 222f and the upper fixing member 222g may be smaller than a thickness or a diameter of the wiring material 142. Then, the upper fixing member 222g is maintained in a floated state, which is floated more than an initial state, when the wiring material 142 passes, and then, the wiring material 142 can be returned to the initial state after the wiring material 142 has passed. Thus, the wiring material 142 can be passed. Also, according to this, since a pressing force of the wiring material 142 by the upper fixing member 222g may act a little, the wiring material 142 can stably moves at the inside of the flux 220a. The lower control member 222f and the upper fixing member 222g do not provide a tensile force or the like to the wiring material 142 and do not disturb the coating of the flux 220a on the wiring material 142 at the corresponding portion.

For example, in a direction parallel to the movement path of the wiring material 142, a ratio of a width of the coating-amount control portion (e.g., a width of the lower control member 222f and/or a width of the upper fixing member 222g) to an interior width of the flux bath 222 may be 80% or more (e.g., 80% to 90%). Then, an amount of the flux 220a applied or coated on the wiring material 142 can be controlled as a whole in the movement path of the wiring material 142. In a direction perpendicular to the movement path of the wiring material 142, a length of the coating-amount control portion (e.g., the lower control member 222f and/or the upper fixing member 222g) is the same as or longer than a total length of a portion where a plurality of inlets 222a or a plurality of outlets 222b, which the wiring materials 142 passes through, respectively, are formed. Then, a coating amount of the flux 220a applied or coated on the plurality of wiring materials 142 passing through the plurality of inlets 222a or the plurality of outlets 222b can be entirely controlled.

For example, the coating-amount control portion may be disposed so as to be biased to be closer to the outlet 222b than the inlet 222a. When the coating-amount control portion is adjacent to the outlet 222b, the coating amount of the flux 220a can be adjusted more stably. However, embodiments are not limited thereto. Thus, the coating-amount control portion may be spaced at the same distance between the inlet 222a and the outlet 222b, or may be disposed so as to be biased to be closer to the inlet 222a than the outlet 222b. Various other variations are possible.

In the embodiment, the coating amount of the flux 220a is controlled by the coating-amount control portion positioned inside the flux bath 222. Accordingly, it is not necessary to perform an additional process (e.g., air blow, etc.) such as a process for controlling the amount of the flux 220a on the wiring material 142 passing through the outlet 222b of the flux portion 220. Thus, a process and a structure can be simplified. An additional structure for blocking the inlet 222a and the outlet 222b of the flux bath 222 for separating the flux bath 222 from the outside flux 220a is not provided. Thus, the inlet 222a and the outlet 222b are connected or open to the outside, the flux 220a can easily flow to the outside of the flux bath 222 through the inlet 222a and the outlet 222b, and the flux 222a flowing to the outside of the flux bath 222 can be reused. Thus, a structure can be simplified. More particularly, a structure, a device, an apparatus, or so on for moving the wiring material 142 can be greatly simplified while allowing the wiring material 142 to move in the dipped state within the flux 220a.

For example, the flux portion 220 may further include an outer flux bath 224 that receives the flux bath 222 and accommodates the flux 220a flowing over the flux bath 222. Then, the flux 220a positioned in the outer flux bath 224 can be circulated to the flux bath 222 for reuse. Particularly, in the embodiment, at least a part of the inlet 222a and at least a part of the outlet 222b of the flux bath 222 are positioned below the surface 220b of the flux 220a, and an amount of the flux 220a flowing over the flux bath 222 may be large. Therefore, the cost can be reduced by reusing the flux 220a.

As an example, a feeding member 228 may be included. The feeding member 228 circulates and supplies a flux 220a discharged from the outer flux bath 224 and/or a flux 220a discharged from a flux tank 226 which is positioned outside and supplies a new flux 220a to the flux bath 222. The flux 220a is supplied to the flux bath 220 by controlling an amount of the flux 220a recirculated from the outer flux bath 224 and/or the flux 220a newly supplied from the flux tank 226 in consideration of a level of the surface 220b of the flux 220a in the flux bath 222. In FIG. 8, it is exemplified that the flux 220a recirculated from the outer flux bath 224 and the flux 220a newly supplied from the flux tank 226 are controlled by one feeding member 228. However, embodiments are not limited thereto. Thus, a feeding member for controlling the flux 220a recirculated from the outer flux bath 224 and a feeding member for controlling the flux 220a newly supplied from the flux tank 226 may be respectively provided. The feeding member 228 may have any of various structures, types, or systems such as a pump, a valve, or the like.

In FIG. 8, au upper end of the outer flux bath 224 may be positioned below the movement path of the wiring material 142, and thus, the movement of the wiring material 142 is not disturbed by the outer flux bath 224. However, embodiments are not limited thereto. For example, the outer flux bath 224 may be positioned so as to overlap with the movement path of the wiring material 142, and the outer flux bath 224 may be provided with a penetration portion through which the wiring material 142 moves.

A flux coating method according to an embodiment using the flux portion 220 and an operation of an interconnector attaching apparatus 200 including the flux portion 220 will be described in detail.

When a wiring material 142 provided from a wiring-material supply portion 210 passes through a flux portion 220, a flux 220a is applied or coated on the wiring material 142 to form a flux layer 220c. More specifically, in the embodiment, a surface 220b of the flux 220a is maintained at a predetermined height (level) or more by a supplying member 222e and a feeding member 228, and the wiring material 142 is passed through an inlet 222a and an outlet 222b of a flux bath 222 positioned below the surface 220b of the flux bath 222 and thus the wiring material 142 moves below the surface 220b of the flux 220a. In this instance, the wiring material 142 may move between a lower control member 222f and an upper fixing member 222g.

The flux 220a is uniformly applied or coated on an surface of the wiring material 142 while the wiring material 142 passes through an inside of the flux 220a and thus a flux layer 220c is formed on the surface of wiring material 142. For example, the flux layer 220c may be formed entirely (e.g., 95% to 100%, more specifically, 99% to 100%) on a surface (a circumstantial surface) of the wiring material 142 in a longitudinal direction, and the flux layer 200c may have a thickness of 2 μm to 7 μm. Thus, the flux layer 220c can be formed to have a sufficient thickness on the entire surface of the wiring material 142. In the embodiment, the wiring material 142 may have a circular cross-section, and the flux 220a may not be directly applied or coated on a surface of the solar cell 150 because the flux 220a is applied or coated and supplied to the wiring material 142. Also, since the flux 220a is applied or coated on the wiring material 142 having the circular cross-section, an amount of the flux 220a for adhering to the solar cell 150 and the wiring material 142 can be minimized, and a performance of the solar cell 150 can be kept excellent.

When the wiring material 142 on which the flux layer 220c is formed passes through a drying portion 230, the flux layer 220c is dried. The coating and the drying of the flux 220a may be performed once each time, or may be performed a plurality of times (for example, twice) to increase the coating amount. The drying portion 230 may be positioned separately from the flux portion 220 outside the flux portion 220. For example, the drying portion 230 may have a shape that encloses a portion except a portion through which the wiring materials 142 pass to have a closed or enclosed space. In the drying portion 230, the flux 220a is dried by a hot air in the closed or enclosed space. Then, the flux 220a can be dried in a short time and the flux layer 220c can be stably formed. However, any of various methods may be applied as a drying method through the drying portion 230. In this instance, a length of the drying portion 230 through which the plurality of wiring materials 142 pass may be larger than a length of the flux bath 222 or the flux portion 220 through which the plurality of wiring materials 142 pass in the extending direction of the wiring material 142 or in a process direction. According to this, even if a speed of movement of the plurality of wiring materials 142 is high, drying by the drying portion 230 can be performed sufficiently. For example, the length of the drying portion 230 may be 400 to 600 mm in the extending direction of the wiring material 142 or in the process direction. The drying by the drying portion 230 may not be sufficient if the length of the drying portion 230 is less than 400 mm, while a space by the drying portion 230 may be excessively large if the length of the drying portion 230 exceeds 600 mm. However, embodiments of the invention are not limited thereto, and the length of the drying part 230 may be variously changed in the extending direction of the wiring material 142 or the process direction.

The wiring material 142 on which the flux layer 220c is formed is provided to the wiring-material transfer portion 240. Only the wiring materials 142 are fixed to a jig 243 to be separate from the solar cell 150 in the wiring-material transfer portion 240 to form a wiring jig combination.

The wiring-jig combination is provided on a work table 252, and solar cell 150 is provided on the work table 252. The solar cell 150 and the wiring materials 142 positioned at a lower portion of the solar cell 150 are fixed on the work table 252 by exhaust adsorption, and the solar cell 150 and the wiring materials 142 positioned at an upper portion of the solar cell 150 are fixed by an upper fixing member 256. Then, the jig 243 fixing the wiring materials 142 is separated from the wiring materials 142 and is transported to the wiring-material transfer portion 240. The solar cell 150, the wiring materials 142, and the upper fixing member 256 together pass through a heat source portion 258 and thus the solar cell 150 and the wiring materials 142 are attached to form a solar cell string. After the attaching process, the flux layer 220c may remain partially or not remain.

According to the embodiment, the wiring material 142 having a rounded portion or a circular cross-section and including a solder layer 142b for soldering can be attached to the solar cell 150 by an automated system.

The flux 220a can be applied or coated on the wiring material 142 by a dipping process without a change in a route and thus the flux 220a having a sufficient thickness can be applied or coated on the wiring material 142 as a whole. Particularly, in the case where the wiring material 142 has a rounded portion or a circular cross-section and includes the solder layer 142b, the flux layer 220c is formed to have a sufficient thickness on an entire surface of the wiring material 142, and thus, an adhesion property with the solar cell 150 can be improved.

Figure 12:
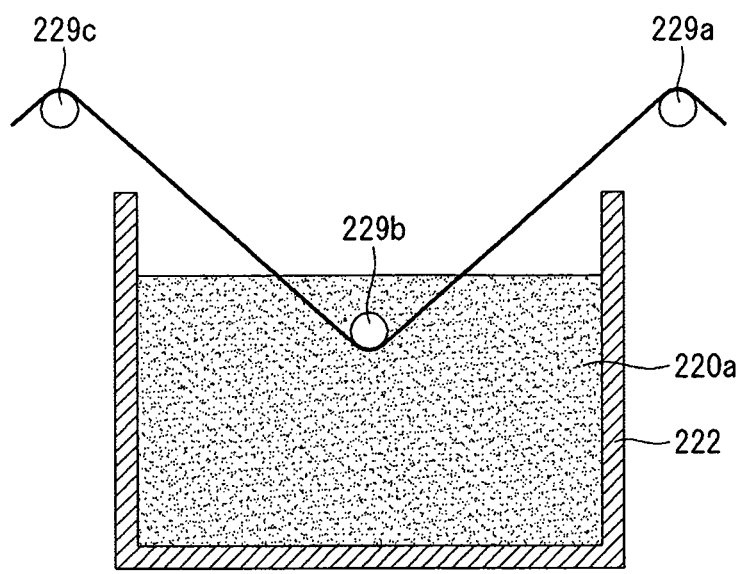
FIG. 12 is a cross-sectional view showing a flux portion of a dipping process using guide rollers and an interconnector where a flux is applied or coated by the flux portion according to the related art.

More specifically, in the related art dipping process shown in FIG. 12, the dipping process is performed by changing a route of the wiring material 142 using a guide roller 229a, 229b, 229c. That is, the wiring material 142 moves from a first guide roller 229a positioned above a surface 220b of a flux 220a to a second guide roller 229b positioned below the surface 220b of the flux 220a, and then, the wiring material 142 moves to a third guide roller 229c positioned above the surface 220b of the flux 220a. Thus, the wiring member 142 moves while contacting the second guide roller 229b which changes the route and therefore pulling force or the like may be undesirably applied to the wiring member 142 at a portion where the second guide roller 229b is positioned. Then, the flux 220a may not be sufficiently applied or coated on the wiring material 142 by the second guide roller 229b or the like. Also, undesirable pulling force may act on the wiring material 142 due to the guide rollers 229a, 229b, and 229c, and therefore, there may be a problem that properties of the wiring material 142 may be changed or the wiring material 142 may be damaged. In particular, when the wiring material 142 has a circular cross-section as in the embodiment, the flux 220a may be more difficult to be uniformly applied or coated with a sufficient coating amount. In addition, since a contact area of the wiring material 142 with the solar cell 150 is small when the wiring material 142 has a circular cross-section as in the embodiment, an adhesion property may be more seriously deteriorated when the coating amount of the flux 220a is small. When the wiring material 142 has a small diameter or width as in the embodiment, unwanted changes in properties, damage, or the like of the wiring material 142 due to a tensile force or the like may occur more seriously.

Alternatively, in the embodiment, the wiring material 142 moves in a non-contact state with the flux bath 222 or the flux portion 220, or a tensile force due to the guide roller 229a, 229b, 229c for changing the route may not applied to the wiring material 142. Thus, the flux 220a can be applied on an entire surface of the wiring material 142 with a uniform thickness, and an unwanted change in properties, damage, etc. of the wiring material 142 can be minimized.

In drawings and the description, for simplicity and clarity, only essential components of an interconnector attaching apparatus 200 according to an embodiment have been shown and described. A cutting portion 244, a fixing member 246, 254, a jig 243, an upper fixing member 256 and the like are provided with a driving member (for example, a motor) and a connect portion connected thereto (for example, an arm) so as to drive them or change positions them. Also, a controller for operating the driving member wirelessly or by wire may be further included. Thus, the interconnector attaching apparatus 200 may be operated as desired. Any of various types, or structures known to the above-described driving member, connect portion, and controller may be used. Although it is shown that an upper portion of the flux bath 222 and the outer flux bath 224 is open, a cover portion covering the upper portion of the flux bath 222 and/or the outer flux bath 224 may be provided. Accordingly, the flux portion 220 (the flux bath 222 and/or the outer flux bath 224) may have a shape that encloses a portion except a portion through which the wiring materials 142 pass to have a closed or enclosed space.

In the description, it is exemplified that the wiring material 142 including the core layer 142a and the solder layer 142b and having a rounded portion (for example, a cross-sectional shape having an overall curved shape) or a circular cross-section is used as an interconnector. Particularly, it is exemplified that the wiring material 142 is applied to a multi-wire structure where the wiring materials 142 of the above-described shape are provided on one surface of the solar cell 150 in a number of 6 to 33 (for example, 8 to 33, for example, 10 to 33, more particularly, 10 to 15). In this instance, it is possible to simultaneously apply or coat the flux 220a on a large number of wiring materials 142 having a small width or the like with a desired amount, thereby simplifying a manufacturing process and improving productivity.

However, embodiments are not limited thereto, and a ribbon having a rectangular cross-section or a flat surface may be used as an interconnector. Even when it is applied to the ribbon, it is possible to prevent damage to the ribbon and uniformly apply or coat a flux to an entire surface of the ribbon.

The features, structures, effects and the like according to the above-described embodiments are included in at least one embodiment of the invention and are not necessarily limited to one embodiment. Further, the features, structures, effects and the like illustrated in the embodiments can be combined and modified by other persons skilled in the art to which the embodiments belong. Therefore, it is to be understood that embodiments of the invention are not limited to these embodiments.

What is claimed is:

1. A flux coating device for a solar cell panel, comprising:
a flux bath configured to receive flux and having an inlet and an outlet; and
a coating-amount control portion positioned on a movement path of an interconnector in the flux bath, the coating-amount control portion being configured to control a coating amount of the flux onto the interconnector,
wherein the inlet and the outlet of the flux bath are configured to pass an interconnector below a surface of the flux,
wherein the coating-amount control portion comprises a lower control member positioned at a lower portion of the movement path of the interconnector and an upper fixing member positioned at an upper portion of the movement path of the interconnector,
wherein the lower control member is positioned in a fixed state within the flux bath, and
wherein the upper fixing member is positioned in a floating state on the flux.

2. The flux coating device of claim 1, wherein the inlet is formed at a first surface of the flux bath,
wherein the outlet is formed at a second surface of the flux bath opposite the first surface of the flux bath, and
wherein at least a part of the inlet and at least a part of the outlet are positioned below the surface of the flux in the flux bath.

3. The flux coating device of claim 2, wherein the flux bath is further configured to coat the flux onto the interconnector by a dipping process of moving the interconnector through the flux from the inlet to the outlet without a change in a route of the interconnector by moving the interconnector in an approximately straight or linear path from the inlet to the outlet.

4. The flux coating device of claim 2, wherein at least one of the inlet and the outlet has an open upper portion extending from an upper portion of the flux bath positioned above a surface of the flux to a portion of the flux bath positioned below the surface of the flux, or
wherein at least one of the inlet and the outlet is a hole formed at the first surface or at the second surface of the flux bath at a position located below the surface of the flux.

5. The flux coating device of claim 2, wherein the inlet comprises a plurality of inlets positioned side by side with a uniform pitch between the plurality of inlets and at a same height at the first surface of the flux bath, and
wherein the outlet comprises a plurality of outlets positioned side by side with a uniform pitch between the plurality of outlets and at a same height at the second surface of the flux bath.

6. The flux coating device of claim 5, wherein the plurality of inlets and the plurality of outlets are positioned at a same height relative to each other.

7. The flux coating device of claim 1, wherein a width or diameter of the inlet and a width or diameter of the outlet are larger than a width or diameter of the interconnector.

8. The flux coating device of claim 1, wherein the flux coating device or the flux bath is configured to move the interconnector therethrough in a non-contact state with the flux coating device or the flux bath.

9. The flux coating device of claim 1, further comprising:
a supplying member or a spouting member formed at a lower portion of the flux bath to supply, jet, spray, eject, or spout the flux in an upward direction.

10. The flux coating device of claim 1, further comprising:
an outer flux bath surrounding at least a portion of the flux bath, the outer flux bath being configured to flow the flux in and out of the flux bath.

11. The flux coating device of claim 10, wherein the outer flux bath is configured to recirculate flux held in the outer flux bath between the flux bath and the outer flux bath for reuse.

12. The flux coating device of claim 1, wherein the interconnector comprises a wiring material or a ribbon.

13. The flux coating device of claim 12, wherein the interconnector comprises the wiring material, and
wherein the wiring material includes:
a rounded portion or a circular cross-section,
a core layer, and
a solder layer formed on a surface of the core layer.

14. An apparatus for attaching an interconnector of a solar cell panel, comprising:
a flux portion configured to coat a flux onto an interconnector; and
an attaching portion configured to attach the interconnector to a solar cell by soldering through providing pressure and heat to the interconnector and the solar cell,
wherein the flux portion includes:
a flux bath for receiving the flux and having an inlet and an outlet configured to pass the interconnector below a surface of the flux in the flux bath; and
a coating-amount control portion positioned on a movement path of an interconnector in the flux bath, the coating-amount control portion being configured to control a coating amount of the flux onto the interconnector,
wherein the coating-amount control portion comprises a lower control member positioned at a lower portion of the movement path of the interconnector and an upper fixing member positioned at an upper portion of the movement path of the interconnector,
wherein the lower control member is positioned in a fixed state within the flux bath, and
wherein the upper fixing member is positioned in a floating state on the flux.

15. The apparatus of claim 14, wherein the interconnector comprises:
a wiring material including:
a rounded portion or a circular cross-section,
a core layer, and
a solder layer formed on a surface of the core layer; and
wherein the apparatus further comprises:
an interconnector supply portion configured to supply the interconnector to the flux portion along a process direction;
a drying portion positioned after the flux portion in the process direction, the drying portion being configured to dry the flux coated on the interconnector by the flux portion to form a flux layer on the solder layer of the wiring material;
a cutting portion configured to cut the interconnector on which the flux layer is formed; and
an interconnector transfer portion positioned after the cutting portion in the process direction, the interconnector transfer portion being configured to hold the interconnector and move the interconnector to the attaching portion.

* * * * *